United States Patent [19]
Frye, Jr.

[11] Patent Number: 5,481,202
[45] Date of Patent: Jan. 2, 1996

[54] OPTICAL SCAN AND ALIGNMENT OF DEVICES UNDER TEST

[75] Inventor: Ronald E. Frye, Jr., Newman, Calif.

[73] Assignee: VLSI Technology, Inc., San Jose, Calif.

[21] Appl. No.: 79,180

[22] Filed: Jun. 17, 1993

[51] Int. Cl.⁶ .................................................. G01R 31/01
[52] U.S. Cl. ............................................ 324/754; 356/237
[58] Field of Search ................................ 324/158 F, 754; 356/376, 237

[56] References Cited

U.S. PATENT DOCUMENTS

| | | | |
|---|---|---|---|
| 3,996,517 | 12/1976 | Fergason et al. | 324/158 P |
| 4,929,893 | 5/1990 | Sato et al. | 324/158 F |
| 5,030,907 | 7/1991 | Yih et al. | 324/158 F |
| 5,091,692 | 2/1992 | Ohno | 324/158 F |
| 5,105,149 | 4/1992 | Tokura | 324/158 F |
| 5,113,132 | 5/1992 | Hoshi | 324/158 F |
| 5,150,041 | 9/1992 | Eastin | 324/158 F |
| 5,160,883 | 11/1992 | Blanz | 324/158 F |
| 5,172,053 | 12/1992 | Itoyama | 324/158 F |
| 5,189,363 | 2/1993 | Bregman | 324/754 |
| 5,237,268 | 8/1993 | Honma | 324/158 F |
| 5,347,363 | 9/1994 | Yamanaka | 356/376 |

FOREIGN PATENT DOCUMENTS 2201804 7/1988 United Kingdom ....................... 11/27

Primary Examiner—Kenneth A. Wieder
Assistant Examiner—Mark A. Wardas
Attorney, Agent, or Firm—Hickman & Beyer

[57] ABSTRACT

Apparatus for scanning an integrated circuit chip or other device under test (DUT) for defects and for visual alignment of chip electrical leads with leads of an electrical tester for testing the chip circuit(s). The apparatus provides an image forming system to provide a visually perceptible image of the chip for chip scanning and chip lead alignment. The apparatus also provides means to translate the chip in a plane containing the chip and rotate the chip about an axis perpendicular to that plane to facilitate alignment of the chip leads with the corresponding electrical tester leads. A computer or operator views the chip through the image forming system and controls chip translation and rotation for scanning and lead alignment for subsequent chip testing.

28 Claims, 6 Drawing Sheets

OPTICAL SCAN AND ALIGNMENT OF DEVICES UNDER TEST

BACKGROUND OF THE INVENTION

1. Technical Field

This invention relates to the semiconductor device fabrication, and more particularly to the testing of integrated circuits.

2. Background of the Technical Art

Final fabrication steps for an integrated circuit (IC) chip often include (1) the alignment and attachment of the IC chip leads to leads of a test device, and (2) the visual scanning of the IC chip leads for defects, such as misalignment.

Conventional chip aligners are used, for example, in test equipment to electrically test the leads of a chip. Mechanical adjustment of the chip lead positions and/or of the chip tester electrical contact positions is performed to correctly align the chip leads and the test leads. These adjustments may be required when a chip is initially placed in a testing area or when different types of chips with different lead configurations are tested in the same testing area.

Alignment is typically accomplished using precision-made machined components and making mechanical adjustments to these components to place the IC chip in the correct, aligned position. The problem with this method is that the machined parts wear out quickly due to the constant adjustments required to align chip leads with test leads. Since the machined parts must be very accurate in their dimensions, the cost in replacing the worn out parts can be high.

A further problem encountered in the prior art is that IC chip leads are now being manufactured with very small lead pitches. These pitches are often smaller than the tolerances of the machined parts, causing errors in aligning and testing the chip leads.

A still further problem in the prior art alignment apparatus is that the chip often slips or alters its position slightly before or during the testing process. The prior art does not address this problem of chip slippage or how to correct the alignment of the chip leads with the test leads once the slippage has occurred.

A visual inspection of the IC chip leads is often performed before or after aligning and electrically testing the leads. The scan is typically done optically, with an operator or computer visually checking for defects in the leads of the chip in a stand-alone apparatus. A problem with this prior art method is that separate machines are required to accomplish the scanning step and the alignment/testing step. Performance of separate tests for the alignment and scan requires additional time in order to move into place and apply the appropriate testing equipment, thus increasing the cost of testing the ICs. Furthermore, the IC leads can be bent out of alignment as they are being moved from the inspection apparatus to the testing apparatus.

What is needed is an approach that allows IC lead alignment and scanning to be accomplished with one apparatus that can be used for multiple purposes. Using one apparatus for both tasks allows more IC's to be tested and reduces damage to the ICs due to excessive handling.

What is further needed is an alignment apparatus that aligns an IC or other device under test after possible slippage of the IC on its testing platform. The apparatus should further provide accurate alignment of the IC leads and the test leads without the use of expensive, precision machined parts that wear out from constant adjustment.

SUMMARY OF THE INVENTION

These needs are met by the present invention, which provides an apparatus to align the leads of a device under test (DUT) with test leads of electrical testing equipment and to scan the leads of a DUT for defects. The apparatus combines both these functions in a single apparatus, thus saving testing time and production expense.

The apparatus comprises a cylindrical test pedestal with a DUT nest for holding a DUT, such as an integrated circuit (IC) chip. A test head including a probe card with electrical test leads is positioned over the DUT. A vision system is positioned over the test head for viewing the probe card leads and the DUT leads. Using the vision system, an operator or computer can scan the leads of the DUT for defects.

The apparatus is also used for aligning the leads of the DUT with the leads of the probe card. The vision system provides a view of the leads of the probe card and the DUT so that alignment of these leads can be visually monitored. To align the leads, stepper motors translate the test pedestal in the plane of the DUT along perpendicular axes; the pedestal can also be rotated about the axis perpendicular to the plane of the DUT. Once the probe card leads and the DUT leads have been aligned, another stepper motor elevates the pedestal to contact the DUT leads with the probe card leads. Electrical testing of the DUT using testing machines in the test head can then begin.

In an alternate embodiment, the vision system can be positioned underneath the DUT pedestal, which still provides a view of the DUT leads and the probe card leads and their spatial relationship for alignment purposes. In another embodiment, the test pedestal includes a DUT translation means, which is operative to move a successive string of DUT's through the DUT nest, testing and scanning each DUT in the string.

The present invention has the advantage of providing an alignment system for the DUT that can compensate for DUT slippage within the nest of the test pedestal. To align the DUT, simple adjustments using the stepper motors are easily and quickly accomplished.

The present invention has the additional advantage of providing an alignment system that does not require large costs to manufacture and does not wear out easily, thus saving production and maintenance costs.

The present invention has the additional advantage of providing alignment/test and scanning functions in a single apparatus. This allows both operations to be performed on an IC chip at one time, saving time and expense.

These and other advantages of the present invention will become apparent to those skilled in the art upon a reading of the following specification of the invention and a study of the several figures of the drawing.

BRIEF DESCRIPTION OF THE DRAWINGS

FIG. 5b is a top plan view of the embodiment shown in FIG. 5a;

DETAILED DESCRIPTION OF THE PREFERRED EMBODIMENTS

Figure 1:
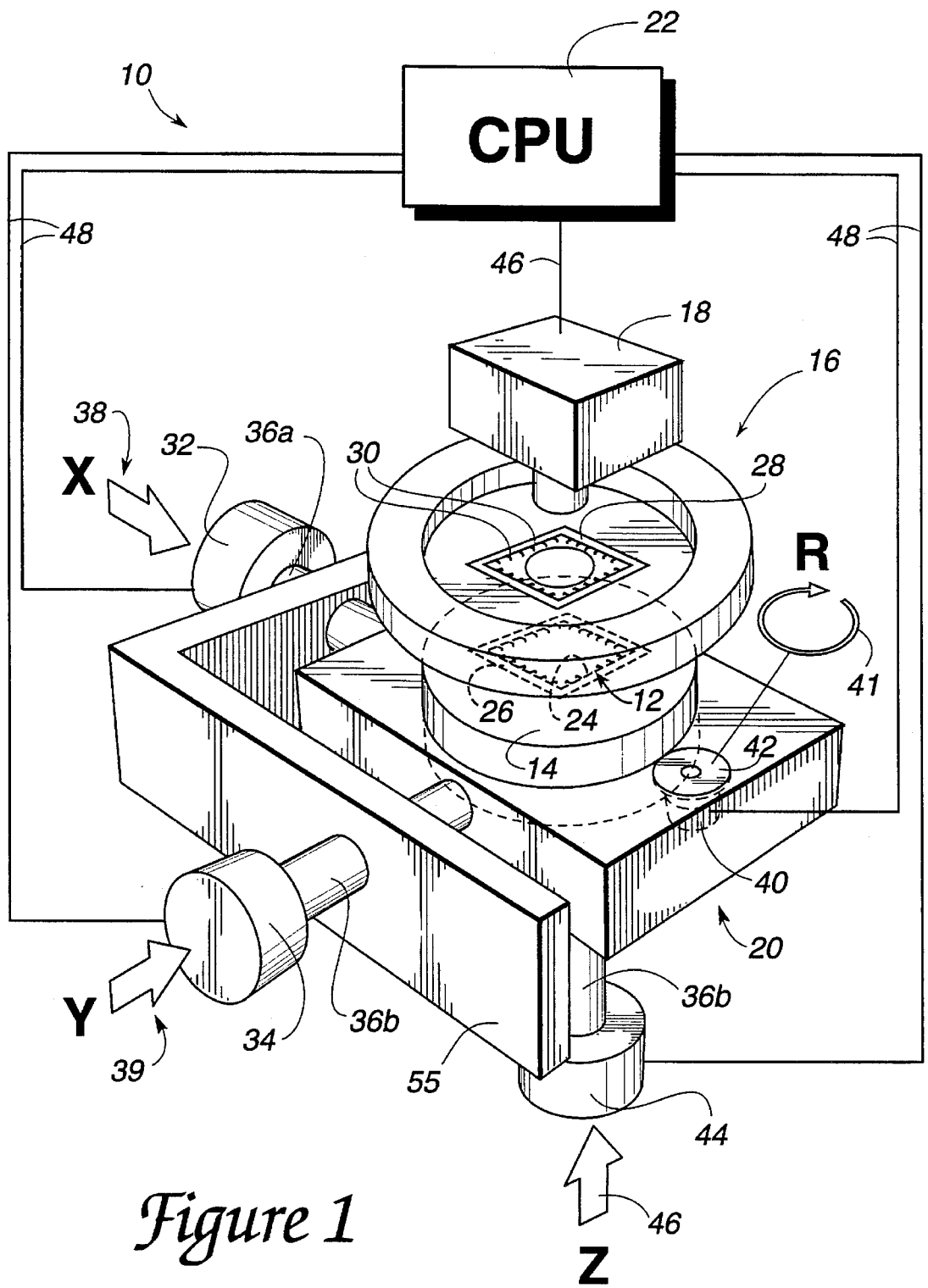
FIG. 1 is a perspective view of an apparatus of the present invention.

FIG. 1 is a perspective view of a test system 10 constructed according to the present invention. The test system 10 includes a device under test (DUT) 12, a test pedestal 14, a test head 16, a vision system 18, a support 20, and a digital computer 22. The DUT 12 is typically a semiconductor integrated circuit (IC) chip that is attached to a leadframe that includes leads 24. See FIG. 3 for an example of a DUT 12.

The test pedestal 14 is, in this preferred embodiment, a cylindrical component that holds DUT 12 for alignment, scan, and test purposes. Pedestal 14 includes a DUT nest 26 that secures the DUT on the pedestal 14 and is fitted specifically for the DUT shape. The nest 26 also preferably includes pegs or similar structures (see FIG. 4a) to fit into holes in the DUT to help secure the DUT to the pedestal 14.

The test head 16 is mounted directly over the DUT nest 26 and provides test leads to contact the leads of the DUT 12. In this embodiment, the test head is statically mounted in its position above the DUT 12. The test head 16 includes a probe card 28 that is approximately aligned with the nest 26 and DUT 12 on the pedestal 14. Probe card 28 includes test leads 30, each of which is configured to contact a corresponding lead 24 of the DUT 12. Each lead 30 of the probe card is coupled to a terminal or other type of connection of a test system (not shown) that is either located inside the test head 16 or is positioned externally and coupled to the leads 30 through cables or similar means. The test system is preferably functional to electrically test the terminals of the DUT 12 by providing test signals, reading outputs, etc. to determine if the circuits on the DUT function correctly. Such testing equipment is well known in the art.

The vision system 18 includes an optical system and is mounted directly over the test head 16 and the DUT 12. The vision system preferably includes a lens for viewing and magnifying the images of the objects below for scanning and aligning purposes. Preferably, the vision system can scan the image of the DUT automatically guided by signals from digital computer 22 (described below).

Alternatively, the vision system 18 is provided with an eyepiece at the top so that an operator can look through the lens of the vision system. To an operator looking through the system from the top towards the bottom, the vision system provides an overhead view and spatial relationship of the probe card 28 and its test leads 30 as well as the DUT 12 and its leads 24 (see FIG. 4c). The operator can also adjust the focus, magnification, etc. of the image seen through the vision system.

The vision system 18 is used to first scan the leads 24 of the DUT 12 for defects that may have occurred in the manufacturing process. The computer 22 or operator then uses the vision system to check if the leads 24 are aligned with the test leads 30 of the probe card 28. If the leads are not aligned, the computer or operator adjusts the position of the DUT 16 by controlling motors in the support 20 (described below).

The vision system 13 can be mounted above the DUT 12 and test head 16 looking directly down on the top of the DUT, as illustrated in FIG. 1; or, alternatively, the vision system can be mounted below the DUT, looking directly up at the bottom of the DUT. In this case, the vision system would provide the computer or operator with the same spatial relationship between the probe card test leads 30 and the DUT leads 24, only the DUT leads would be closer to the vision system than the test leads instead of the opposite arrangement in the previous embodiment.

The vision system optionally includes its own light source (not shown) for illuminating the probe card and DUT. Such a light source can be included internally with the optical system, or it can be used externally to provide illumination on the DUT and probe card from an outside area. The light source can also assume several embodiments, including a diode laser, other laser, Hg lamp or other source of light in the visible wavelength range $0.4 \text{ mm} \leq \lambda \leq 0.7 \text{ mm}$.

Support 20 is positioned below test head 16, and is provided with a cylindrical recess to hold pedestal 14. Support 20 and pedestal 14 can be controllably translated by the computer 22 or the operator. Support 20 can be moved and positioned by two translational stepper motors 32 and 34 which are coupled to the support 20 by shafts 36a and 36b through a bracket 55 and are positioned approximately perpendicular to each other in the plane defined by the x- and y-axes 38 and 39, respectively. In this embodiment, the shafts 36a and 36b abut machined edge surfaces of support 20 to provide slide bearings between the ends of the shafts and the support 20. Motor 32 causes the support 20 and pedestal 14 to move along the x-axis 38, and motor 34 causes the support and pedestal to move along the y-axis 39. This pedestal movement is provided so that the DUT 12 can be translated in two directions to align the leads 24 of the DUT with the test leads 30 of the probe card 28. Stepper motors 32 and 34 can also be used to move the support 20 and pedestal 14 out from under the test head 16 so that a DUT can be loaded or unloaded from nest 26.

The pedestal 14 is also preferably provided with rotational movement to further assist in aligning the leads 24 with the test leads 30. Rotational motor 40 is coupled to the support 20 and provides rotational movement R as shown by arrow 41 for the pedestal 14. Rotational motor 40 engages pedestal 14 with drive wheel 42 at a tangential point and rotates the pedestal from the friction between the wheel and the pedestal. Wheel 42 is preferably provided with an edge that provides good traction with the edge of pedestal 14 so that accurate control of the pedestal is maintained; the edges of pedestal 14 and wheel 42 can also be geared to interlock and provide accurate rotation.

Using motors 32, 34, and 40, the computer can align the DUT leads with the probe card leads. Such alignment is preferable since the nest 26 may not hold the DUT with sufficient accuracy every time a DUT is loaded on the pedestal. Also, after the DUT has been placed on the pedestal, slippage of the DUT can occur, requiring readjustment. The apparatus 10 provides an accurate and convenient readjustment of the DUT position for such circumstances.

The support 20 also includes a translational motor 44 that provides the pedestal 14 with translation along the z-axis 46. A shaft 36c couples the motor 44 with the pedestal 14. Preferably, shaft 36c is threaded and engages a threaded bore of pedestal 14. Once the positions of the DUT leads 24 have been viewed relative to the positions of the test leads 30 by using vision system 18, pedestal 14 is elevated by motor 44 to the height of the probe card 28 (see FIG. 2b).

Digital computer 22 is preferably a microprocessor-controlled digital apparatus that controls the operation of the apparatus 10 with several input/output (I/O) ports. In the preferred embodiment, computer 22 sends and receives information to and from the vision system 18 over bus 46. Computer 22 receives video input from the vision system to check for alignment of the DUT and probe card leads. The computer uses well known algorithms to check the DUT for damaged or defective leads. For example, edge detecting algorithms can detect the edges of the leads and can represent the leads with linear equations. The equations of the leads can then be aligned for parallelness, perpendicularity, and spacing. The computer can store a lead number corresponding to leads that don't meet specifications, or can simply indicate that the leads for that I.C. are not to specifications.

If the leads are not aligned, computer 22 sends output signals on busses 48 to mechanically control the several motors of the apparatus. The computer sends out the appropriate control signals to stepper motors 32, 34, and 40 to translate the pedestal 14 and align the leads 24 of the DUT with the leads 30 of the test head. Once this is accomplished, computer 22 sends an output signal to motor 44 to elevate the pedestal and make contact between leads 24 and leads 30. Electrical testing of the DUT 12 using testing equipment coupled through test head 16 may then commence.

In an alternate embodiment where an operator views the images through the vision system 18, the computer 22 need not be coupled to the vision system. The operator can adjust the motors 32, 34, 34, and 40 by directly controlling the computer 22. The operator can also control the motors with manual controls that are well-known in the art.

Figure 2A:
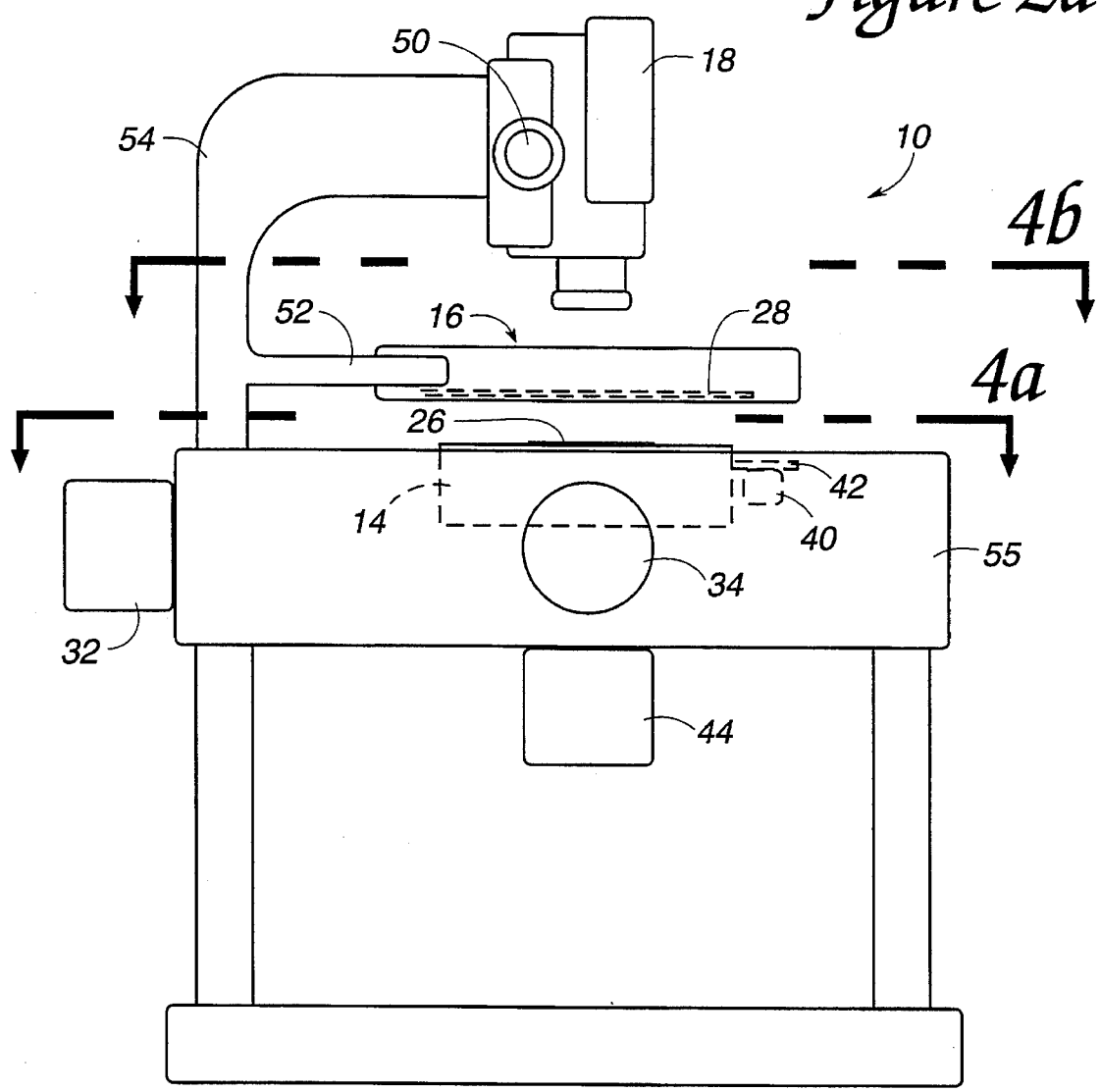
FIG. 2a is an elevational side view of the present invention with the test pedestal in a loading position.

FIG. 2a is an elevational side view of the apparatus of the present invention. Pedestal 14 is in its lowered position, where a DUT 12 is loaded in the nest 26. In an alternate embodiment, adjustment knob 50 on the vision system 18 is used to focus the image seen by an operator looking through the central vertical aperture of the vision system. Test head 16 is held in a stationary position by support 52, which is attached to a vertical support 54. Vision system 18 is also coupled to the vertical support 54, which is coupled to central base support 55. Central base support 55 holds the motors 32, 34, 40 and 44, and secures the support 20 (not shown) to the apparatus 10.

Figure 2B:
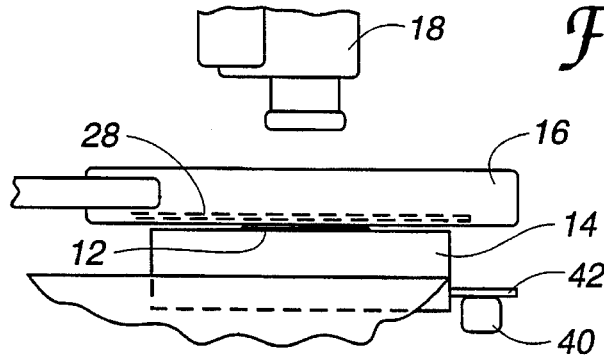
FIG. 2b is an elevational side view of the present invention with the test pedestal in a testing position.

FIG. 2b shows the pedestal 14 in its raised position. A DUT 12 in place on the pedestal 14 has been aligned with the probe card 28 in test head 16 in a previous adjustment. The leads 24 of DUT 12 are brought into contact with the leads 30 of probe card 28 by raising pedestal 14 using stepper motor 44. The pedestal stops moving upwardly once the leads 24 (FIG. 1) make firm contact with the test leads 30 (FIG. 1). Electrical testing apparatus (not shown) are coupled to the leads 30 through the test head 16 and support 52 and perform electrical testing of the DUT after the pedestal has been elevated.

Figure 3:
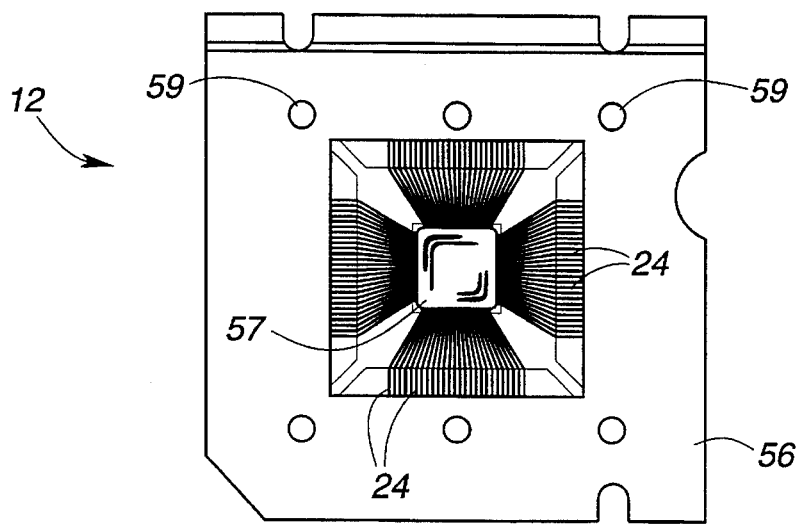
FIG. 3 is a top plan view of a device under test (DUT) that can be used in the present invention.

FIG. 3 shows an example of a DUT 12 that can be used with the present invention. An integrated circuit (IC) die 57 is located in a central position, and conductive leads 24 are coupled to electrical circuitry in the integrated circuit. Leads 24 project generally radially from the die 57 such that ends of the leads 24 can be formed into the leads of an integrated circuit package to provide input and outputs to the IC. The leads 24 of the leadframe can be organized in many different configurations; however, they are generally spaced closely together so as to achieve a large number of leads in a small area, and thus have a very small pitch. The lead pitch of a DUT such as the one shown in FIG. 3 is typically about 20 mils.

Holder 56 is typically made from an insulating material, such as plastic, and provides a secure means to hold the DUT 12 in position so that it may be placed on the nest 26 of the apparatus 10. The holder is similar in size and shape to the holder for a 35 mm slide. The holder 56 is provided with holes 59 for alignment purposes.

Figure 4C:
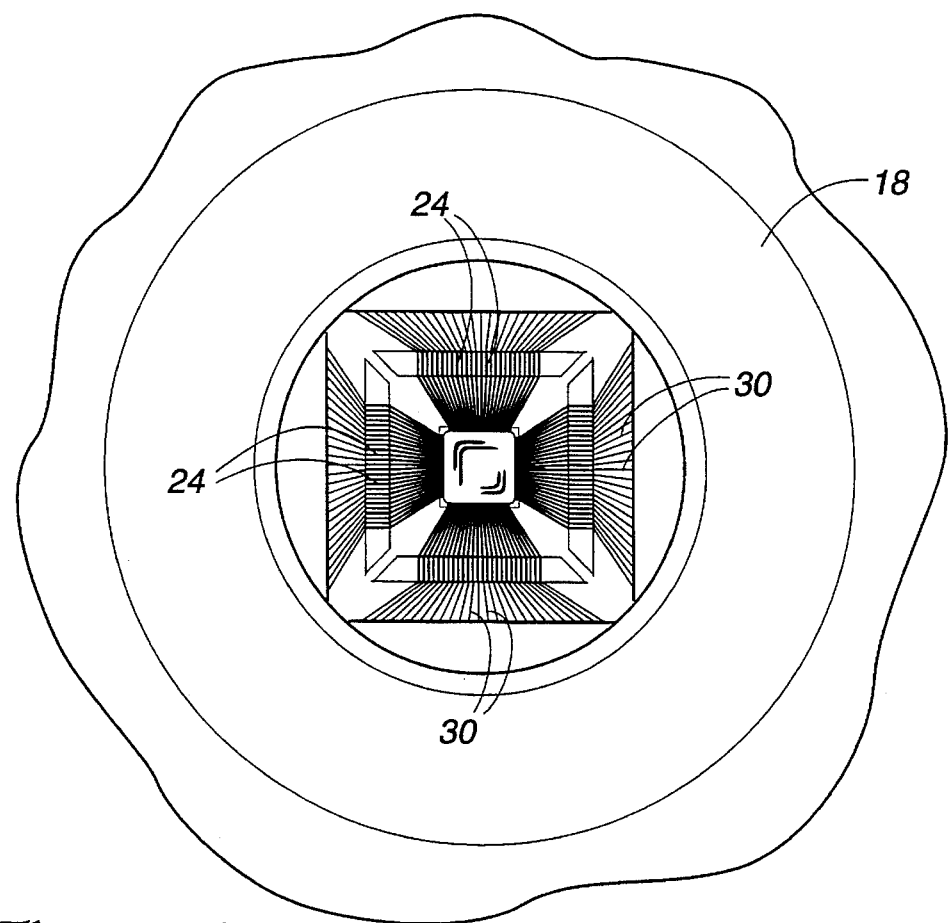
FIG. 4c is detail view of the view through the vision system of the probe card leads and the DUT.
Figure 4A:
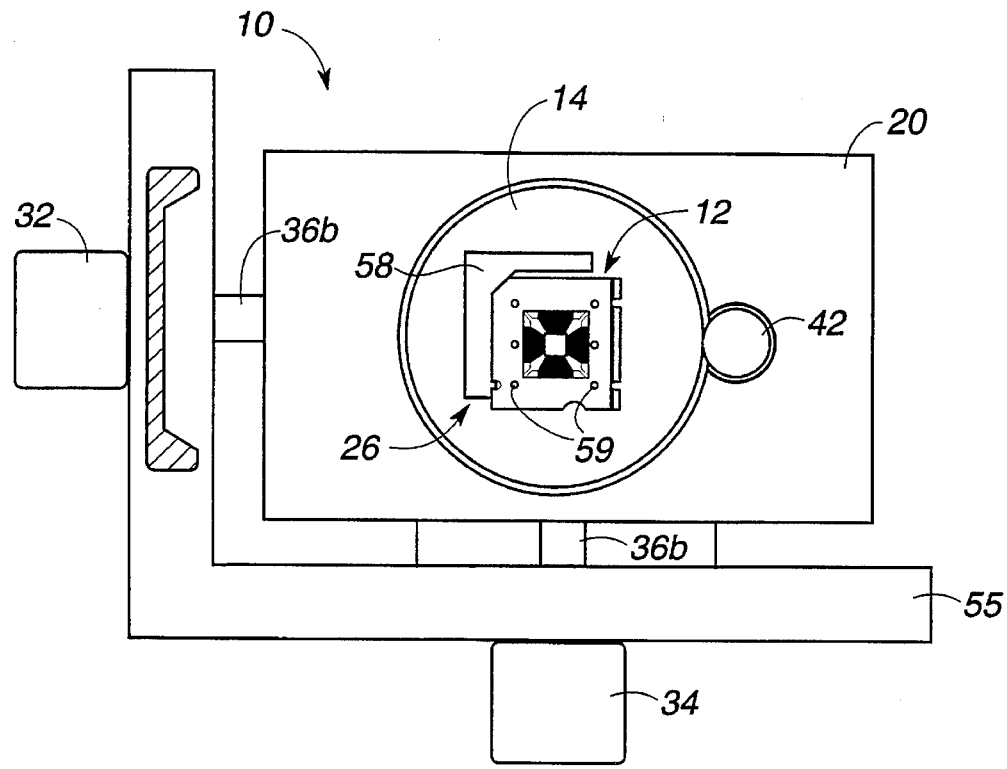
FIG. 4a is a cross-sectional top plan view of the apparatus shown in FIG. 2a and the DUT.

FIG. 4a is a cross-sectional view taken along line 4a—4a of FIG. 2a. A DUT 12 as shown in FIG. 3 is shown on the pedestal 14. DUT 12 is aligned with pedestal 14 by engaging guide pins (not shown) with the holes 59 on the DUT. Edge guide 58 also helps to align the DUT 12 with the nest 26.

Figure 4B:
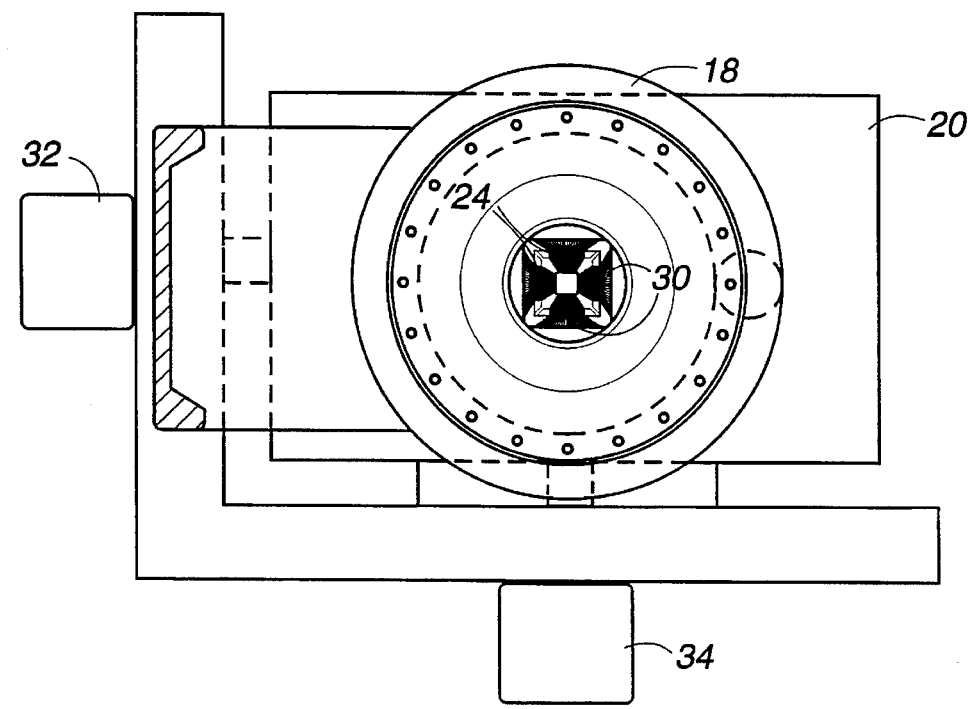
FIG. 4b is a cross-sectional top plan view of the apparatus shown in FIG. 2a showing the probe card and DUT.

FIG. 4b is a cross sectional view taken along line 4b—4b of FIG. 2a, and shows the view of the probe card leads 30 and the DUT leads 24. The leads 30 of the probe card 28 are shown aligned with the leads 24 of the DUT 12. Once these leads are aligned, the pedestal 14 can be elevated so that the leads of the DUT contact the corresponding leads of the probe card, and the DUT can be tested with testing machines.

FIG. 4c is a detailed view as seen by the vision system 13 with the probe card leads 30 aligned with the DUT leads 24. Since the configuration of leads can differ depending on the DUT being tested, the probe card 28 must be changed if a differently-configured DUT is tested. Specific probe cards can be made for commonly-tested DUT's.

Figure 5A:
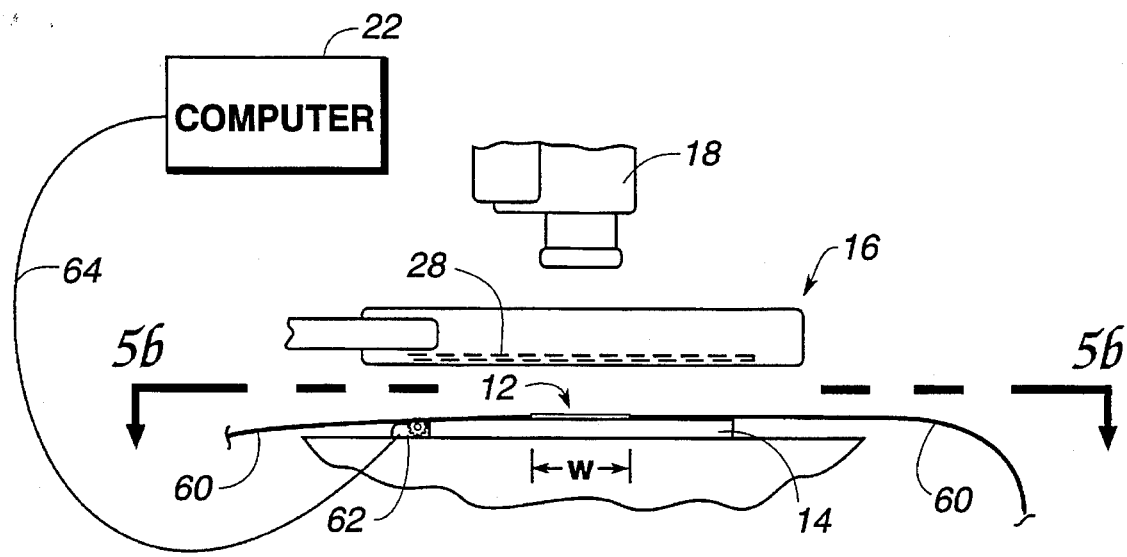
FIG. 5a is a side elevational view of an alternate embodiment of the invention.

FIG. 5a shows an alternate embodiment of the present invention in which several DUT's are coupled together in a long continuous tape 60. The tape 60 is moved in one direction and each DUT is scanned, aligned and tested, one at a time. To accomodate this type of DUT, a gear wheel 62 is included on one side of the pedestal 14. The teeth of the gear wheel fit into sprocket holes along the edge of the DUT tape 60. The computer 22 can control the gear wheel to move the strand along in increments equal to the width w of a single DUT on the tape. Computer 22 sends control signals to the gear wheel 62 along bus 64.

Figure 5B:
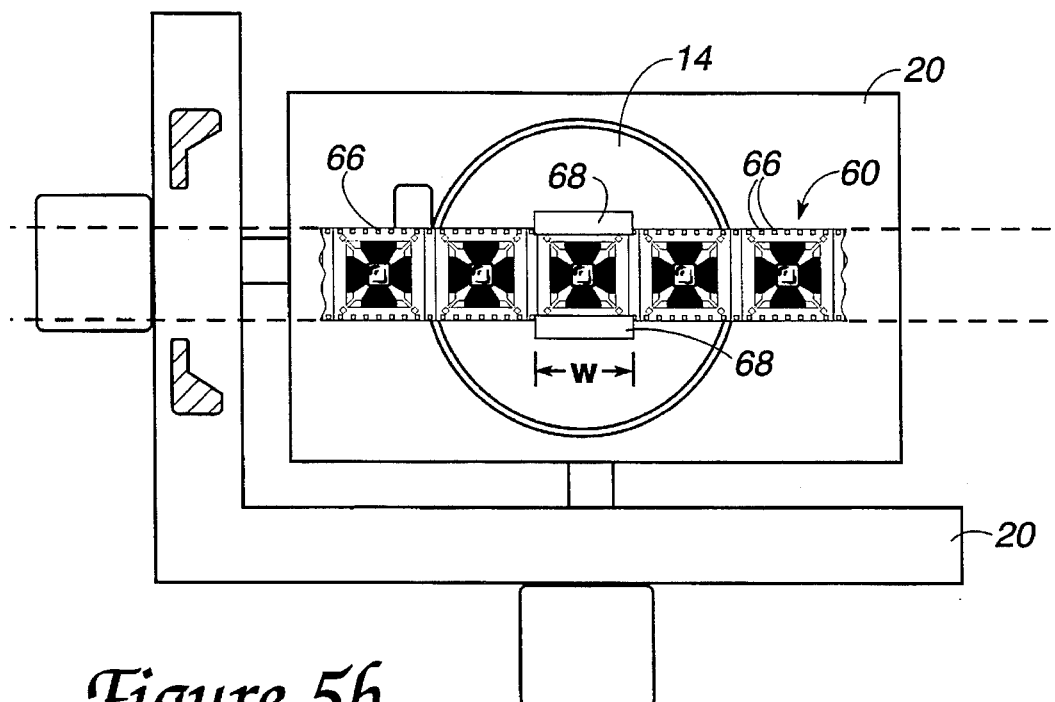

FIG. 5b is a top plan view taken along line 5b—5b in FIG. 5a. Sprocket holes 66 in the DUT tape 60 are shown in this view. Guides 68 also assist in keeping the DUT tape 60 centered and positioned accurately on pedestal 14. Each DUT of the tape 60 must be aligned as in the previous embodiment so that the leads 30 of the probe card 28 contact the leads 24 of the DUT when the pedestal 14 is elevated.

Figure 6:
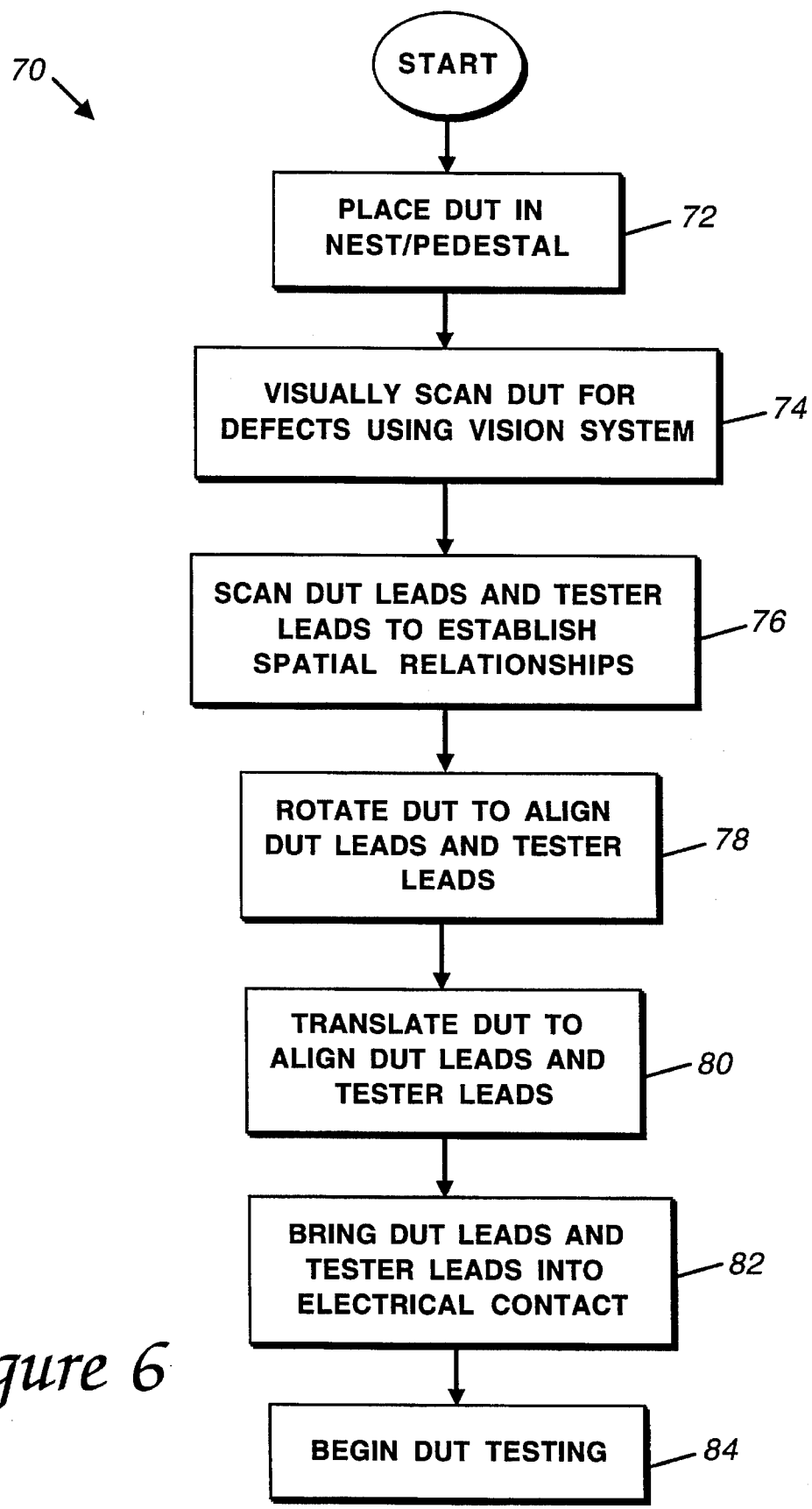
FIG. 6 is a flow chart illustrating a method for practice of the invention.

FIG. 6 is a flow chart 70 illustrating a method for practicing the invention illustrated in FIG. 1. In step 72, the DUT 12 is placed in the nest 26 and the DUT is brought into the field of view of the vision system 18, using one or more stepper motors 32 and 34 if necessary. In step 74, the computer or operator visually scans the DUT 12 for defects, using the image provided by the vision system 18. In step 76, the DUT leads 24 and the probe card leads 30 are scanned to determine their relative spatial relationships and to determine if alignment is required. In step 78, the DUT 12 is rotated, if necessary, in the plane of the DUT by the rotational stepper motor 44 to align the DUT leads 24 with the corresponding probe card leads 30. In step 80, the DUT 12 is then translated, if necessary, in the plane of the DUT by the translational stepper motor 32 and 34 to position the DUT leads 24 directly under or opposite the corresponding probe card contacts 30. In step 82, the DUT leads 28 and the corresponding probe card leads 30 are than brought into contact with each other, and, in step 84, electrical testing of the DUT 12 begins using a testing apparatus coupled to the probe card leads 30.

As a result of the incorporation of a mechanical chip aligner and a chip optical scanner in a single device, scanning and lead alignment may be performed on the entire DUT in a single integrated operation, with at most minor movement of the DUT and using a single computer-controlled mechanism for all tasks. This approach allows compensation for any reasonable slippage of DUT leads or other related dimensional variations.

While this invention has been described in terms of several preferred embodiments, it is contemplated that alterations, modifications and permutations thereof will become apparent to those skilled in the art upon a reading of the specification and study of the drawings. It is intended that the following appended claims include all alterations, modifications and permutations that fall within the spirit and scope of the present invention.

What is claimed is:

1. An apparatus for testing a device under test (DUT), the apparatus comprising:
    an integrated circuit test head including a probe card having a plurality of electrical leads;
    a DUT nest for receiving and holding a DUT, said DUT being an integrated circuit chip having a plurality of electrical leads extending therefrom;
    an image forming device aligned with said probe card for forming an image of said DUT and said probe card;
    a scanning controller coupled to said image forming device for controlling said image forming device to examine said plurality of electrical leads of said DUT for defects; and
    a displacement controller coupled to said DUT nest for controllably moving said DUT nest in a plane containing said DUT and along an axis perpendicular to said plane containing said DUT;
    whereby said DUT may be moved so that each DUT electrical lead makes contact with a corresponding electrical lead of said probe card.

2. An apparatus as recited in claim 1 wherein said DUT nest includes a cylindrical test pedestal.

3. An apparatus as recited in claim 2, wherein said displacement controller includes a rotation mechanism operative to rotate said test pedestal about an axis that is substantially perpendicular to said plane containing said DUT.

4. An apparatus as recited in claim 3, wherein said rotation mechanism includes a stepper motor.

5. An apparatus as recited in claim 1, wherein said displacement controller includes a translation mechanism capable of translating said test pedestal along two mutually perpendicular axes in said plane containing said DUT.

6. An apparatus as recited in claim 5, wherein said translation mechanism includes a plurality of stepper motors.

7. An apparatus as recited in claim 1, wherein said displacement controller includes a digital computer.

8. An apparatus as recited in claim 1, wherein said displacement controller comprises a manually operated displacement control mechanism for translation and rotation of said DUT.

9. An apparatus as recited in claim 1, wherein said image forming device is positioned above said test head.

10. An apparatus as recited in claim 1, wherein said image forming device includes a video camera assembly.

11. An apparatus as recited in claim 10, wherein said visually perceptible image of said DUT is formed approximately perpendicular to a plane containing said DUT.

12. An apparatus as recited in claim 11, wherein said image forming device includes a light source positioned to illuminate said DUT with light having at least one wavelength 1 in the range $0.4 \text{ mm} \leq 1 \leq 0.7 \text{ mm}$.

13. An apparatus as recited in claim 1 wherein said DUT nest includes a translation device operative to move a plurality of DUTs coupled together to sequentially position DUTs in said DUT nest.

14. An apparatus as recited in claim 1 wherein said DUT is an integrated circuit chip electrically coupled to a leadflame having said DUT electrical leads.

15. A method for testing a device under test (DUT) comprising:
    simultaneously viewing a DUT having electrical leads and a probe card having electrical leads using an image forming device;
    scanning said DUT for defects in said electrical leads using said image forming device;
    moving said DUT so that said electrical leads of said DUT are aligned with said electrical leads of said probe card;
    moving said DUT so that said electrical leads of said DUT contact said electrical leads of said probe card; and
    testing the operation of said DUT.

16. A method as recited in claim 15 wherein said step of viewing said DUT includes viewing said DUT with a video camera coupled to a digital computer.

17. A method as recited in claim 15 wherein said step of moving said DUT includes rotating said DUT in the plane of said DUT.

18. A method as recited in claim 17 wherein said step of moving said DUT includes at least one linear movement in the plane of said DUT.

19. A method as recited in claim 15 further comprising a step of moving said DUT out of view of said image forming device and moving a second DUT into view of said image forming device alter said step of electrically testing the operation of said DUT.

20. An apparatus for testing an integrated circuit coupled and attached to a leadframe comprising:
    a probe card provided with a plurality of test leads;
    a leadframe nest for receiving and holding a leadframe having a plurality of leadframe leads and an integrated circuit attached and coupled thereto, said leadframe nest including a guide for positioning said leadframe securely in said leadframe nest;
    a viewer for simultaneously viewing said test leads and said leadframe leads;
    a scanning controller coupled to said viewer to examine said leadframe leads for defects; and
    an adjusting mechanism responsive to said viewer for providing relative motion between said probe card and said leadframe nest to align said test leads with said leadframe leads.

21. An apparatus as recited in claim 20 further comprising an analyzer responsive to said viewer for determining whether said leadframe leads are within positional specifications.

22. An apparatus as recited in claim 20 wherein said viewer comprises a video camera.

23. An apparatus as recited in claim 20 wherein said viewer further comprises a digital computation apparatus coupled to said video camera.

24. An apparatus as recited in claim 23 wherein said adjusting mechanism is controlled by said digital computation apparatus.

25. An apparatus as recited in claim 20 wherein said adjusting apparatus moves said leadframe nest.

26. An apparatus as recited in claim 25 wherein said adjusting apparatus is capable of rotating said leadframe nest.

27. An apparatus as recited in claim 25 wherein said adjusting apparatus is capable of translating said leadframe nest in an x-y plane.

28. An apparatus as recited in claim 20 wherein said leadframe is one of a plurality of leadframes coupled together in an elongated strip, said apparatus further comprising:
   a leadframe translation device for sequentially moving said leadframe into and out of said nest.

* * * * *